(12) United States Patent
Chen

(10) Patent No.: US 7,728,320 B2
(45) Date of Patent: Jun. 1, 2010

(54) SEMICONDUCTOR MEMORY DEVICE AND PHASE CHANGE MEMORY DEVICE

(75) Inventor: Wei-Su Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 633 days.

(21) Appl. No.: 11/463,899

(22) Filed: Aug. 11, 2006

(65) Prior Publication Data
US 2007/0152205 A1    Jul. 5, 2007

(30) Foreign Application Priority Data
Dec. 29, 2005    (TW) .............................. 94147152 A

(51) Int. Cl.
*H01L 47/00* (2006.01)
(52) U.S. Cl. ..................... 257/4; 257/214; 257/298; 257/758; 257/E45.003; 257/E27.004; 257/E21.667; 257/E27.102; 257/E21.268; 257/296; 257/E47.005; 438/479
(58) Field of Classification Search ................. 257/214, 257/298, E45.003, 4, 758, E21.667, E21.268, 257/E27.102, 296
See application file for complete search history.

(56) References Cited

U.S. PATENT DOCUMENTS 7,002,195 B2*  2/2006  Park ............................ 257/295
7,064,344 B2*  6/2006  Xu ................................ 257/5
7,135,696 B2*  11/2006  Karpov et al. ................... 257/2
2003/0219924 A1*  11/2003  Bez et al. ..................... 438/102
2005/0064606 A1*  3/2005  Pellizzer et al. ................ 438/3
2005/0191804 A1*  9/2005  Lai et al. ..................... 438/238

FOREIGN PATENT DOCUMENTS

EP        1339111 A1    8/2003

* cited by examiner

Primary Examiner—Wai-Sing Louie
Assistant Examiner—Marc Armand
(74) Attorney, Agent, or Firm—Jianq Chyun IP Office

(57) ABSTRACT

A phase change memory (PCM) device includes a substrate, bottom electrodes disposed in the substrate, a first dielectric layer disposed on the substrate, second dielectric layers, third dielectric layers, cup-shaped thermal electrodes, top electrodes, and PC material spacers. In the PCM device, each cup-shaped thermal electrode contacts with each bottom electrode. Second and third dielectric layers are disposed over the substrate in different directions, wherein each of the second and third dielectric layers covers a portion of the area surrounded by each cup-shaped thermal electrode, and the third dielectric layers overlay the second dielectric layers. The top electrodes are disposed on the third dielectric layers, wherein a plurality of stacked structure composed of the third dielectric layers and the top electrodes are formed thereon. The PC material spacers are formed on the sidewalls of each stacked structure and physically and electrically contact the cup-shaped thermal electrodes and the top electrodes.

9 Claims, 10 Drawing Sheets

SEMICONDUCTOR MEMORY DEVICE AND PHASE CHANGE MEMORY DEVICE

CROSS-REFERENCE TO RELATED APPLICATION

This application claims the priority benefit of Taiwan application serial no. 94147152, filed Dec. 29, 2005. All disclosure of the Taiwan application is incorporated herein by reference.

BACKGROUND OF THE INVENTION

1. Field of the Invention

The present invention relates to a semiconductor memory device and method of fabricating the same, and more particularly, to a semiconductor memory device and phase change memory device with a small heating area formed through a simple process, and a method of fabricating the same.

2. Description of Related Art

Along with the rapid development and advanced function requirements of portable products, nowadays a global market demand for memory is expanding rapidly, wherein the fast development of non-volatile memory is most remarkable. Accordingly, factories and research institutes are vigorously developing next generation memory device. Among various types of memory devices, phase change memory (PCM) device and Magnetoresistive RAM (MRAM) have drawn great interest.

Phase change memory is a non-volatile memory device comprising a phase change film whose resistance changes when the crystal phase of the phase change material changes under a thermal effect. The smaller area of the phase change film subjected to thermal effect through which the current passes, the smaller heating current is required for changing phase, and the smaller the RESET/SET driving current is. Correspondingly, a smaller drive transistor area is required, i.e. a smaller size memory unit cell. Therefore, various research are directed to the design of the size of heating area of the phase change film, for example, disclosed in EP 1339111 which was published in 2003.

However, at present, most known techniques relate to complicated method of etching contact holes in the dielectric layer or sacrificial layer for reducing heating area of the phase change film. When the contact holes are of a nanometer size, it would be difficult to reliably fill the hole and yield of the phase change film would be reduced significantly, and the dry pre-cleaning for the contact holes before film-coating becomes too complicated.

SUMMARY OF THE INVENTION

The present invention provides a phase change memory (PCM) device having reduced heating area.

The present invention further provides a method of fabricating a small size PCM device, wherein the fabrication yield is substantially increased.

The present invention still provides a simple method of fabricating a PCM device.

The present invention yet provides a semiconductor memory device suitable for a micro-size or a nano-size non-volatile memory unit cell.

The present invention provides a PCM device comprising a substrate, a plurality of bottom electrodes, a first dielectric layer, a plurality of cup-shaped thermal electrodes, pluralities of second and third dielectric layers, a plurality of top electrodes, and a plurality of PC material spacers. The bottom electrode is formed in the substrate. The first dielectric layer is formed on the substrate. The cup-shaped thermal electrodes are formed in the first dielectric layer, and bottoms of the cup-shaped thermal electrodes are connected to the bottom electrodes. The second dielectric layers are disposed on the substrate in a first direction, wherein the second dielectric layers cover a portion of the area surrounded by each cup-shaped thermal electrodes. The third dielectric layers are disposed on the substrate in a second direction, wherein the third dielectric layers cover a portion of the area surrounded by the cup-shaped thermal electrodes and overlays the second dielectric layers. The top electrodes are disposed on the third dielectric layers, wherein a strip of stacked structure is composed of the third dielectric layers and the top electrodes. The PC material spacers are disposed on the sidewalls of the stacked structures, and physically and electrically connected to the cup-shaped thermal electrodes and the top electrodes.

The present invention further provides a method of fabricating a PCM device comprising providing a substrate having a plurality of bottom electrodes formed thereon. Next, a first dielectric layer is formed on the substrate, wherein a plurality of cup-shaped thermal electrodes is formed in the first dielectric layer, and wherein the bottoms of the cup-shaped thermal electrodes are connected to the bottom electrodes. A plurality of second dielectric layers is formed on the substrate, wherein the second dielectric layers cover a portion of the area surrounded by the cup-shaped thermal electrodes in a first direction. A plurality of stacked structures are formed on the substrate, wherein the stacked structures cover a portion of the area surrounded by the cup-shaped thermal electrodes in a second direction, and wherein the stacked structures includes the third dielectric layers and the top electrodes. A phase change (PC) film is formed on the substrate, covering the stacked structures and the second dielectric layers, and then the PC material film is etched anisotropically to form PC material spacers on the sidewalls of the stacked structures. The PC material spacers are physically and electrically connected to the cup-shaped thermal electrode and top electrode. The PC material spacers formed on the sidewalls of the second dielectric layers are removed.

The present invention further provides a method of fabricating a PCM comprising providing a substrate having a plurality of bottom electrodes formed therein. A first dielectric layer is formed over the substrate, wherein a plurality of cup-shaped thermal electrodes is in the first dielectric layer, and the bottom of the cup-shaped thermal electrodes contact the bottom electrodes. A plurality of second dielectric layers is formed over the substrate, wherein the second dielectric layers cover a portion of the area surrounded by the cup-shaped thermal electrode in a first direction. The edge of each second dielectric layer is rounded. A plurality of stacked structures is formed over the substrate, and each stacked structure covers a part of the area surrounded by each cup-shaped thermal electrode in a second direction. Each stacked structure is composed of a third dielectric layer and a top electrode. A PC material film is formed on the substrate, covering the stacked structures and the second dielectric layers. Next, the second dielectric layer is anisotropically etched to form PC material spacers on the sidewalls of the stacked structures. The spacer physically and electrically contacts the cup-shaped thermal electrodes and the top electrodes.

The present invention also provides a semiconductor memory device comprising a substrate, a plurality of bottom electrodes, a first dielectric layer, second dielectric layer, a plurality of third dielectric layers, a plurality of cup-shaped electrodes, a plurality strips of top electrodes, a plurality of conductive spacers and a non-volatile memory unit cell. The bottom electrodes are formed in the substrate. The first dielectric layer is disposed on the substrate. The cup-shaped electrodes are disposed in the first dielectric layer and the bottoms of the electrodes are connected to the bottom electrodes. The second dielectric layers are disposed over the substrate in the first direction, wherein each second dielectric layer covers a portion of the area surrounded by each cup-shaped electrode. The third dielectric layers are disposed over substrate in the second direction, wherein each third dielectric layer covers a part of the area surrounded by each cup-shaped electrode, and overlays the second dielectric layers. The top electrodes are disposed on the third dielectric layers such that the third dielectric layers and the top electrodes form stacked structures. The conductive spacers are disposed on the sidewalls of the stacked structures, and are physically and electrically connected to the cup-shaped electrodes and top electrodes. The non-volatile memory unit cell is inserted between each conductive spacer and each cup-shaped electrode.

The present invention further provides a structure with two "crossed" electrode spacers, which include a bottom electrode spacer and a top electrode spacer. The bottom electrode spacer is disposed over a substrate in a first direction and the top electrode spacer is crossed over the bottom electrode spacer in a second direction.

The present invention employs spacers comprised of phase change material as the contact hole structures of the thermal electrodes so the size of contact area between the phase change material and the thermal electrode in PCM device is smaller than that formed by a photolithography process, and is smaller than that of "surface contact structure". Moreover, the process of the present invention is simpler than the conventional process. Furthermore, problems caused by the misalignment of the phase change material and the contact holes of the top electrodes can be effectively avoided. In the process provided by the present invention, the difficulty of filling the holes due to the size of the holes being too small, or the difficulty of plasma gas entering into the holes when the top portions of the film on sidewalls are jointed may be effectively avoided. Furthermore, when the planarization of the PC material film is developed successfully, the cross spacer structure of the present invention is not limited to application in the phase change memory, but can also be applied in a 3D-NVM structure.

In order to the make aforementioned and other objects, features and advantages of the present invention comprehensible, a preferred embodiment accompanied with figures are described in detail below.

It is to be understood that both the foregoing general description and the following detailed description are exemplary, and are intended to provide further explanation of the invention as claimed.

DESCRIPTION OF EMBODIMENTS

FIGS. 1A to 1G are views illustrating the process steps of fabricating a phase change memory (PCM) device according to a preferred embodiment of the present invention.

Figure 1A:
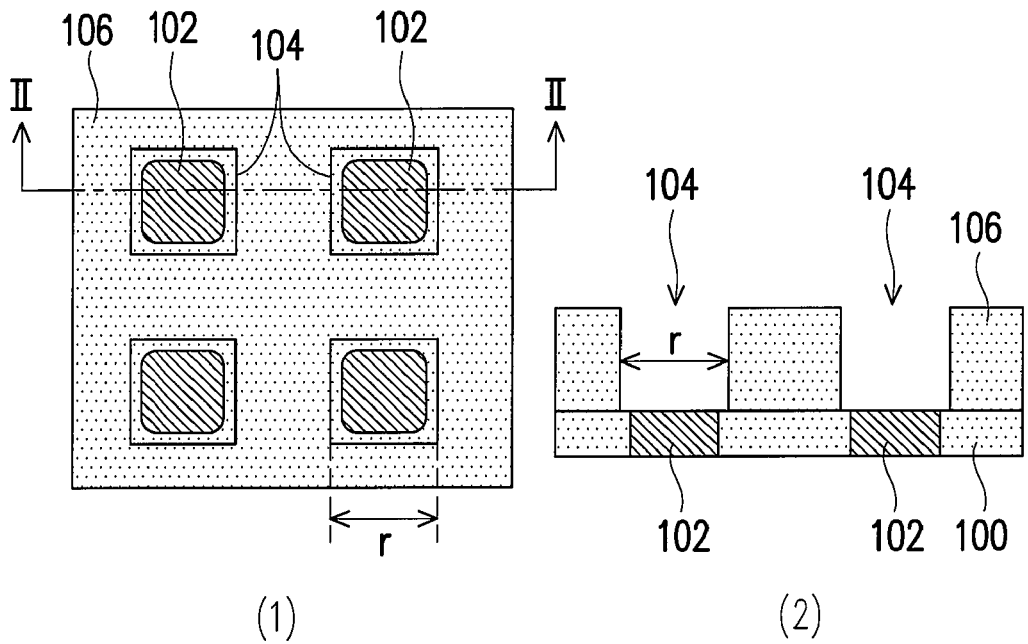
FIGS. 1A to 1G are views illustrating the process steps of fabricating a phase change memory (PCM) device according to a preferred embodiment of the present invention.

Referring to FIG. 1A, Part (1) is a top view of the device, and Part (2) is a sectional view along line II-II of Part (1). First, a substrate 100 having a plurality of bottom electrodes 102 formed therein is provided. Next, a first dielectric layer 112 is disposed over the substrate, for example, having a first oxide layer 106 comprising a plurality of openings 104 formed therein, wherein the openings 104 exposes the bottom electrodes 102. The aperture r of each opening 104 corresponds to the thickness of the subsequently formed PC material spacers, which will be described in detail later.

Figure 1B:
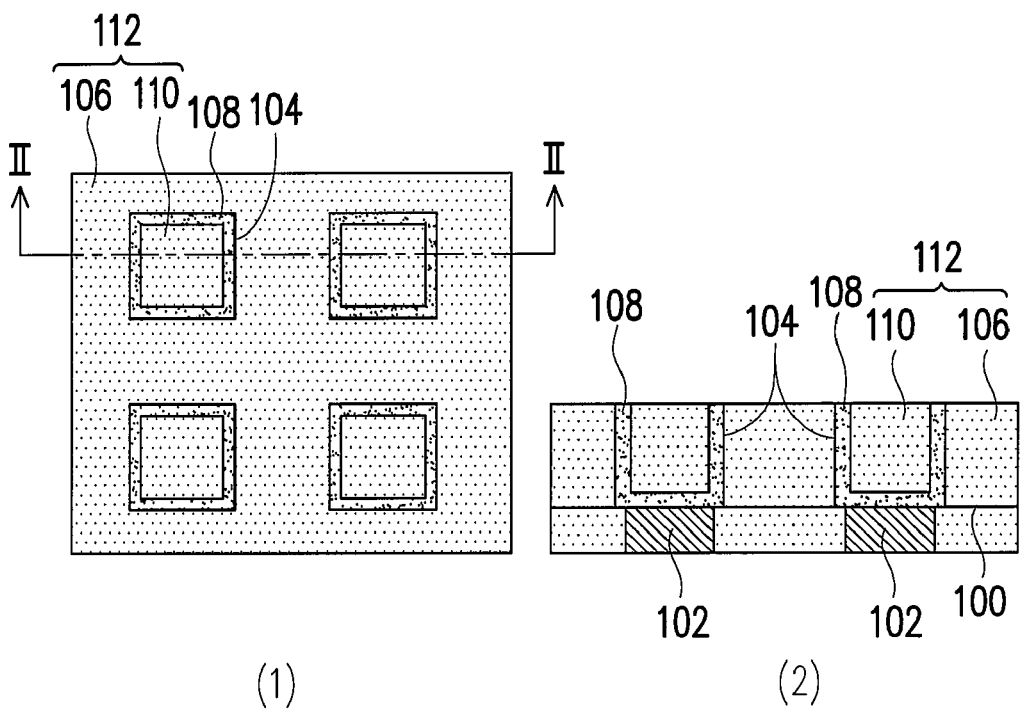

Referring to FIG. 1B, Part (1) is a top view of the device, and Part (2) is a sectional view along the line II-II of Part (1). A thermal electrode material is formed over the substrate 100, wherein the thermal electrode material covers the first oxide layer 106, the inner surfaces of the openings 104 and the bottom electrodes 102. A second oxide layer 110 is formed over the thermal electrode material to fill the openings 104. A planarization process is performed to remove portions of the second oxide layer 110 and the thermal electrode material disposed outside the openings 104, where the remaining thermal electrode material forms cup-shaped thermal electrodes 108. The thermal electrode material comprises, for example, transition or refractory metal nitrides such as TiN or TaN, W, nitrided metal silicide, polysilicon, amorphous silicon or a metal silicide, and the thickness thereof is less than 20 nm. The bottoms of the cup-shaped thermal electrodes 108 contact the bottom electrodes 102. The first oxide layer 106 and the second oxide layer 110 together form the first dielectric layer 112. It should be noted that the first dielectric layer 112 is not limited to only oxide layers, any other suitable dielectric material may also be utilized.

Figure 1C:
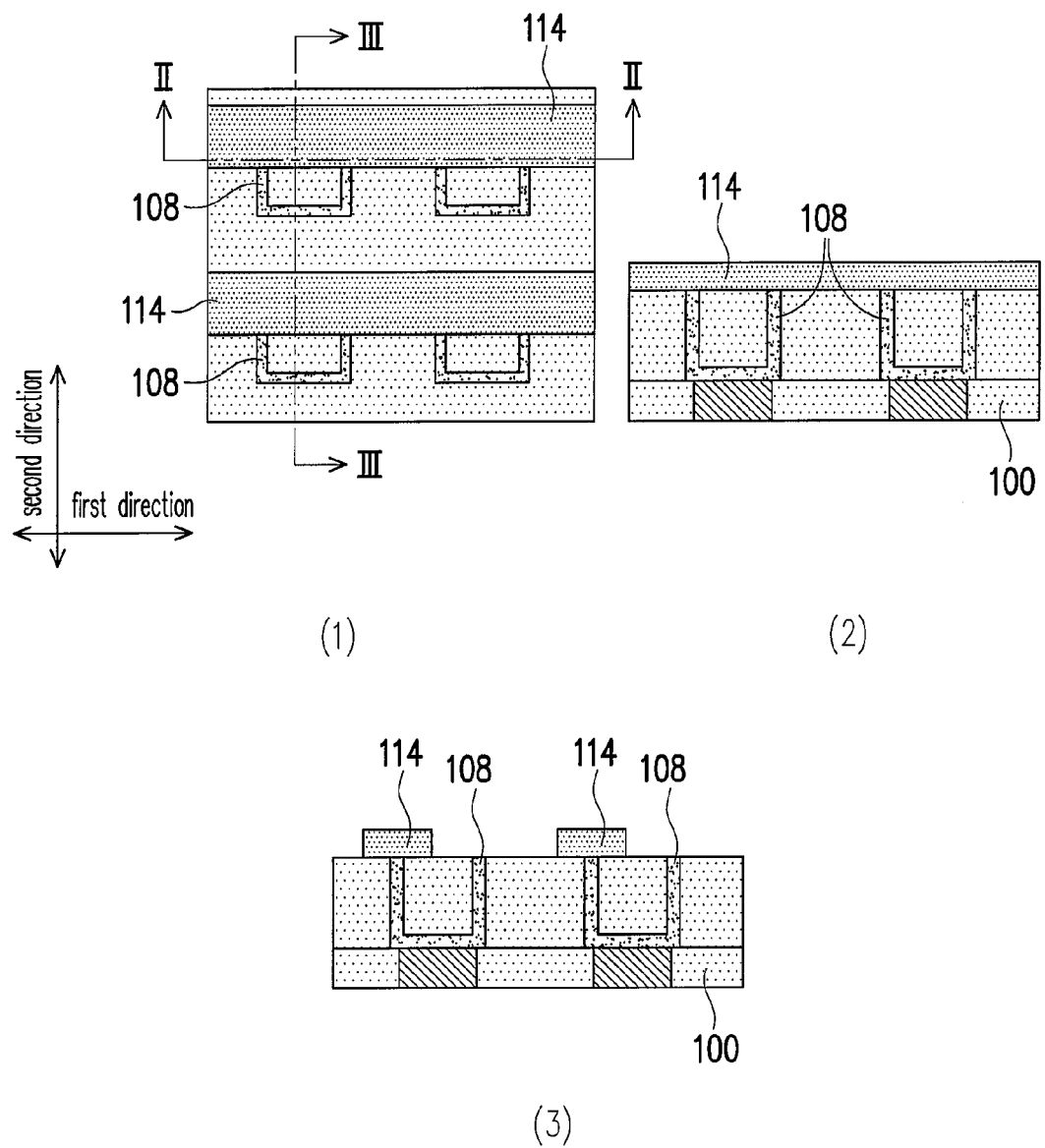

Referring to FIG. 1C, Part (1) is a top view of the device, the second view is a sectional view along the line II-II of Part (1), and Part (3) is a sectional view along line III-III of Part (1). A plurality of second dielectric layers 114 is formed over the substrate 100, wherein each second dielectric layer 114 covers a portion of the area surrounded by each cup-shaped thermal electrode 108 in a first direction. The thickness of the second dielectric layer 114 is, for example, 60 nm. The step of forming the second dielectric layers 114 comprises, for example, forming a nitride film on the substrate 100 first, and then performing a photolithography and etching process to form the second dielectric layers 114 in the first direction.

Figure 1D:
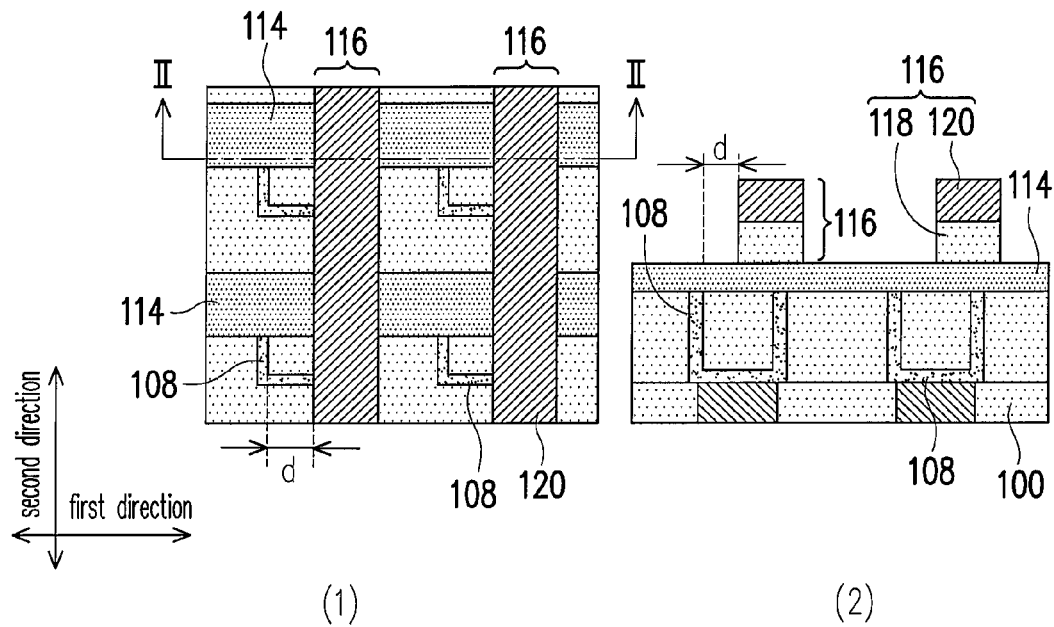

Referring to FIG. 1D, Part (1) is a top view of the device, and Part (2) is a sectional view along the line II-II of Part (1). A plurality of stacked structures 116 is formed over the substrate 100, and each strip of stacked structure 116 covers a portion of the area surrounded by each cup-shaped thermal electrode 108 in a second direction. A gap with a width d is particularly formed between the stacked structure 116 and the inner side of the cup-shaped thermal electrode 108 so as to prevent the increase in the contact surface area between the subsequently formed PC material spacers and the cup-shaped thermal electrode 108. Moreover, the first direction is different from the second direction, for example, the first direction may be perpendicular to the second direction as shown in this FIG. 1D. The step of forming the stacked structure 116 includes, for example, sequentially forming a third dielectric layer 118 and a top electrode 120 over the substrate 100, and then performing a photolithography and etching process. The top electrode 120 comprises, for example, TiW, transition or refractory metal nitrides such as TiN or TaN, Al, Cu/TaN, nitrided metal silicide, polysilicon, amorphous silicon or a metal silicide or any other suitable conductive material, the thickness of the third dielectric layer 118 is, for example, 100 nm, and the thickness of the top electrode 120 is, for example, 100 nm. In an example, if the design of the mask and the setting of the stepper allow, the mask for forming the stacked structure 116 and the mask for forming the second dielectric layer 114 can be the same, but rotated 90° for exposure.

Figure 1E:
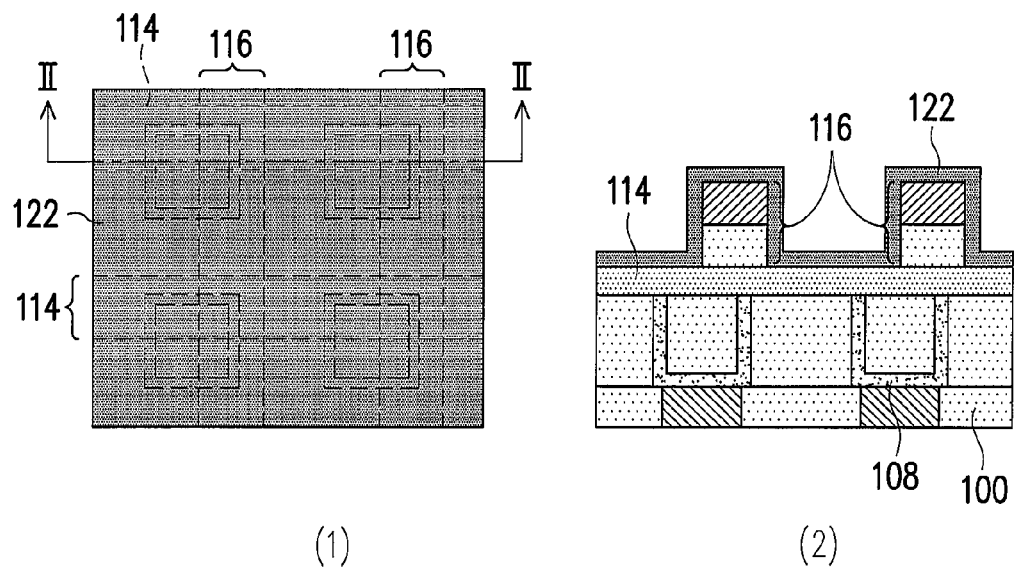

Referring to FIG. 1E, Part (1) is a top view of the device, and Part (2) is a sectional view along the line II-II of Part (1). A PC material film 122 is formed on the substrate 100 to cover the stacked structures 116 and the second dielectric layers 114.

Figure 1F:
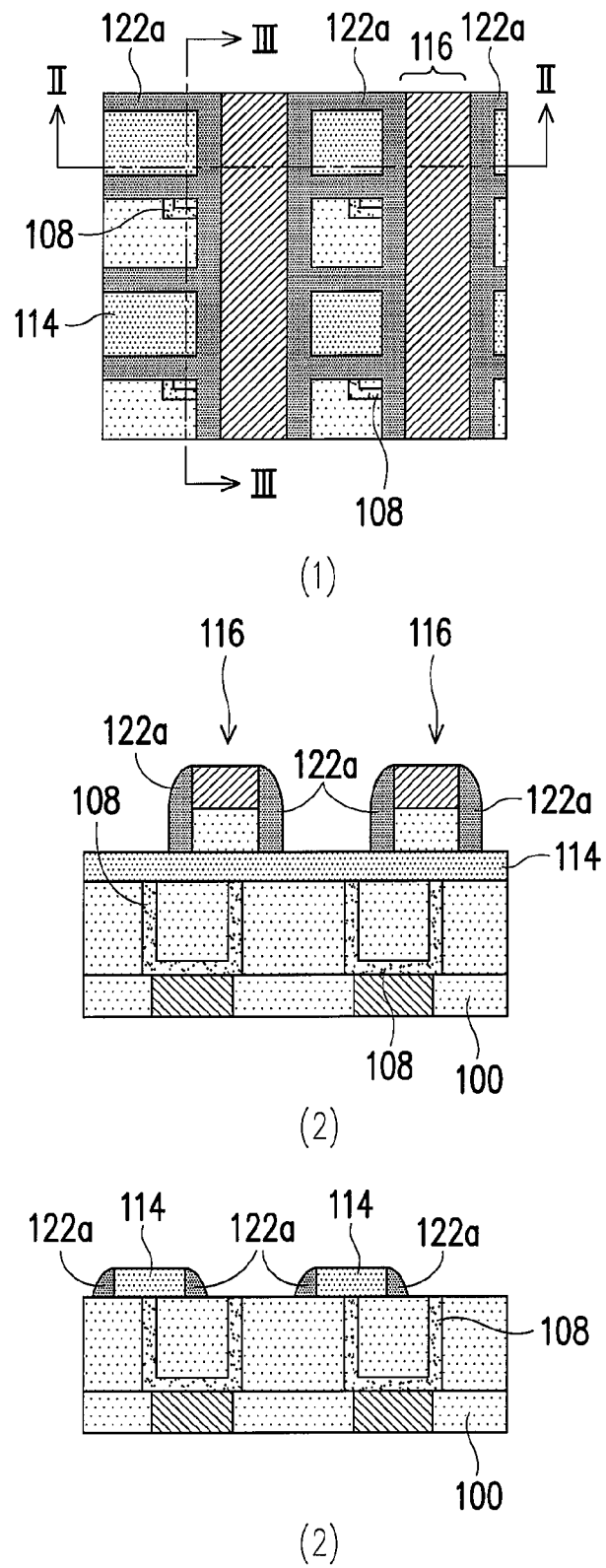

Referring to FIG. 1F, Part (1) is a top view of the device, Part (2) is a sectional view along the line II-II of Part (1), and Part (3) is a sectional view along the line III-III of Part (1). The PC material film 122 is anisotropically etched (as shown in FIG. 1E), to form PC material spacers 122a on the sidewalls of the stacked structures 116. The PC material spacers 122a contact the cup-shaped thermal electrodes 108 (as shown in Part (1)). However, as the second dielectric layers 114 have vertical sidewalls, the PC material spacers 122a are also located on the sidewalls of the second dielectric layers 114 (as shown in Part (3)).

Figure 1G:
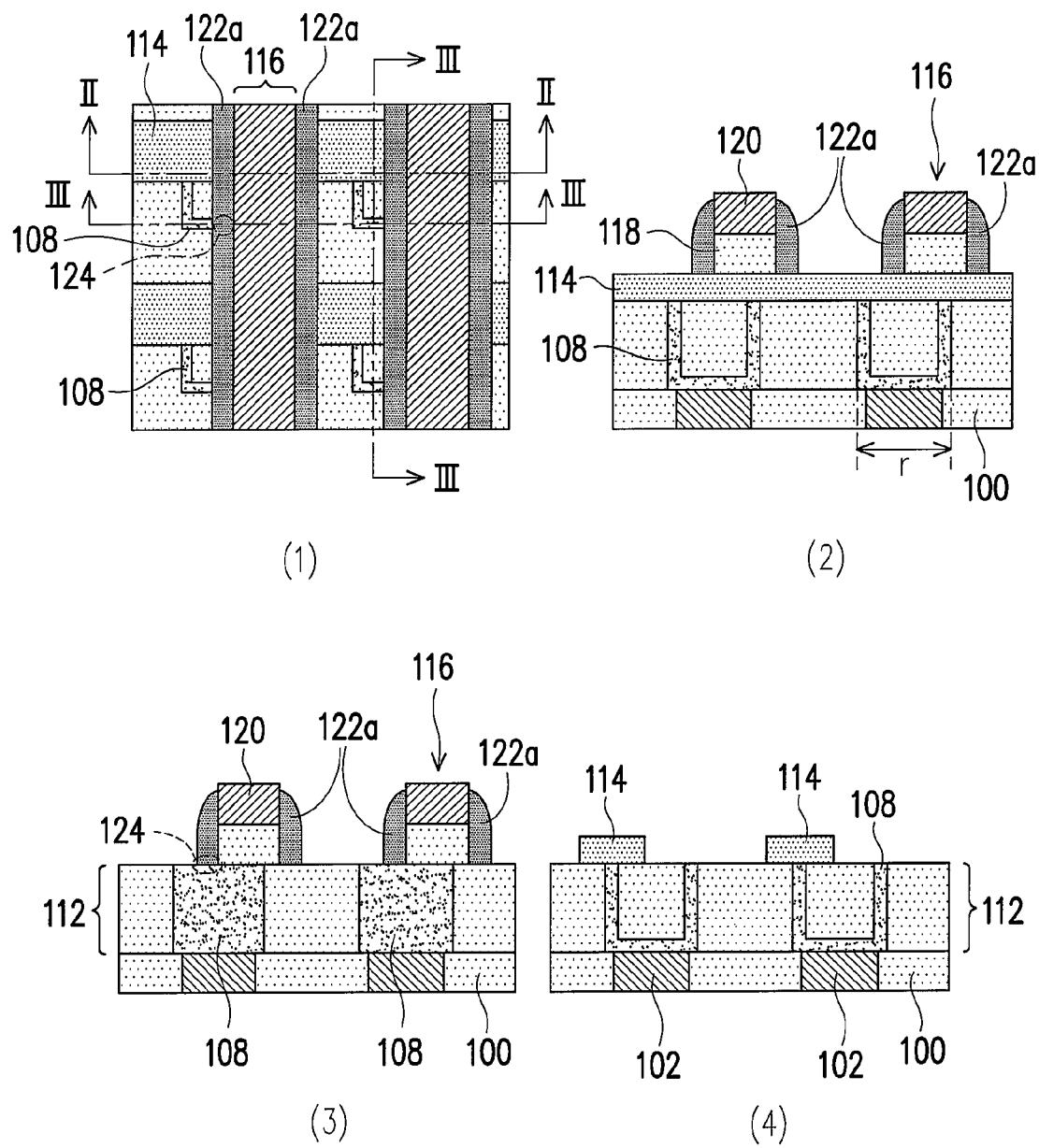

Referring to FIG. 1G, Part (1) is a top view of the device, and Part (2), Part (3), and Part (4) are sectional views along the line II-II, line III-III, and line IV-IV of Part (1) respectively. The PC material spacers 122a are over-etched to remove the PC material film on the sidewalls of the second dielectric layer 114. The time of over-etching the PC material spacers 122a is, for example, the same as that or longer than that of etching step used for reducing the thickness of the PC material spacers 122a. When the aperture r of each opening 104 (referring to FIG. 1A) is 0.2 µm, the thickness of the PC material spacers 122a is between 20-50 nm (the value is determined by a maximum overlay error tolerance of the various lithographic steppers, and generally follows a principle of "a half of the thickness of the PC material spacers plus the maximum overlay error tolerance is equal to a half of the width of the area surrounded by each cup-shaped thermal electrode"). Furthermore, if the thickness of the PC material spacers 122a reaches 100 nm, the aperture r is accordingly increased.

It can be seen from FIG. G that the PCM device of the present invention employs the PC material spacers 122a as contacts 124 of the entire device, and therefore, the contact area between the PC material spacers 122a and the thermal electrode 108 can be smaller than that fabricated using a photolithography process. Thus, fabrication of the smallest contact area may be realized.

FIGS. 2A to 2E are views illustrating the process steps of fabricating a PCM device according to another preferred embodiment of the present invention, wherein means same or similar to the above embodiment are indicated by the same component symbols or numerals of FIGS. 1A to 1G.

Figure 2A:
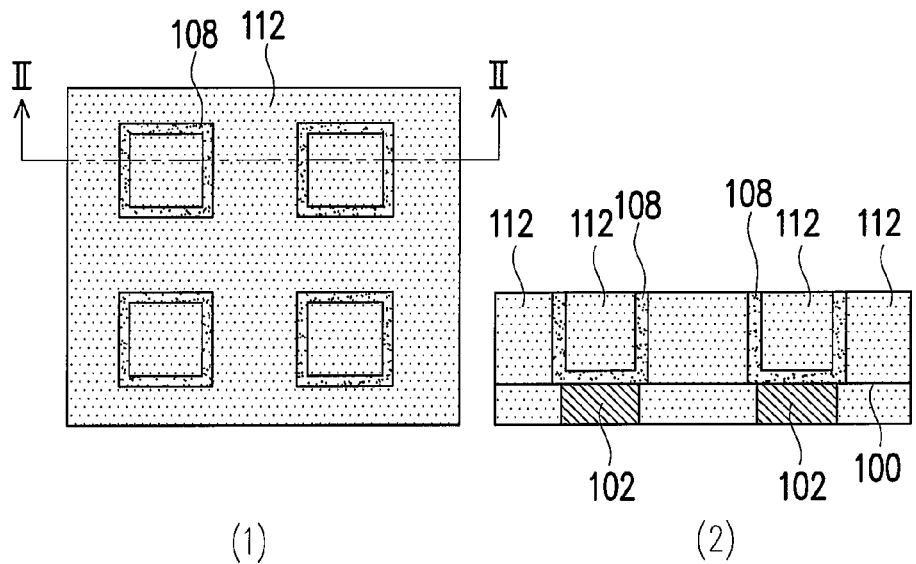
FIGS. 2A to 2E are views illustrating the process steps of fabricating a PCM device according to a preferred embodiment of the present invention.

Referring to FIG. 2A, Part (1) is a top view of the device, Part (2) is a sectional view along a line II-II of Part (1). The process steps according to this embodiment of the present invention are the same as those described above with reference to FIGS. 1A to 1B. A substrate 100 having a plurality of bottom electrodes 102 formed therein is provided. Next, a first dielectric layer 112 comprising cup-shaped thermal electrodes 108 formed therein is provided over the substrate 100, wherein the bottom of each cup-shaped thermal electrode 108 contacts with each bottom electrode 102.

Figure 2B:
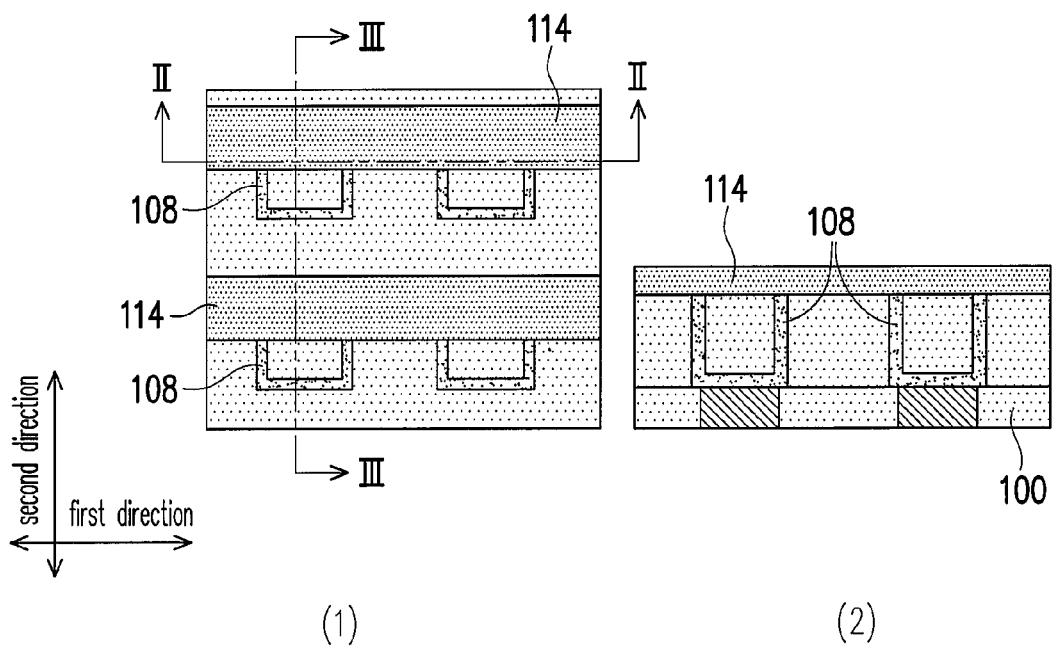

Referring to FIG. 2B, Part (1) is a top view of the device, and Part (2) is a sectional view along the line II-II of Part (1). A plurality of second dielectric layers 114 is formed over the substrate 100, wherein each second dielectric layer 114 covers a portion of the area surrounded by each cup-shaped thermal electrode 108 in a first direction.

Figure 2C:
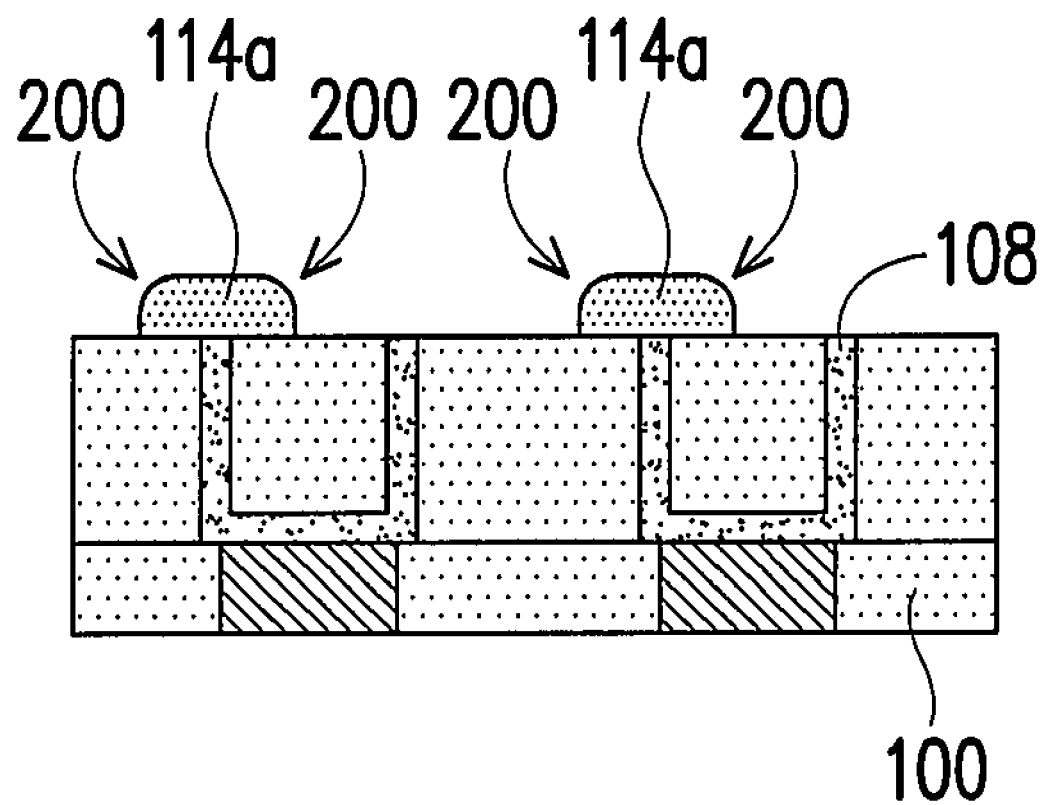

Referring to FIG. 2C, it is a sectional view of a subsequent process along the line III-III of Part (1) of FIG. 2B. Edges 200 of each second dielectric layer 114 (referring to FIG. 2B) are rounded, so as to form rounded second dielectric layers 114a. The method of forming rounded second dielectric layers comprises, for example, a performing a cleaning step using inductively coupled plasma-Ar (ICP-Ar), or an isotropic (partly or fully) dry etching process, or a wet etching process.

Figure 2D:
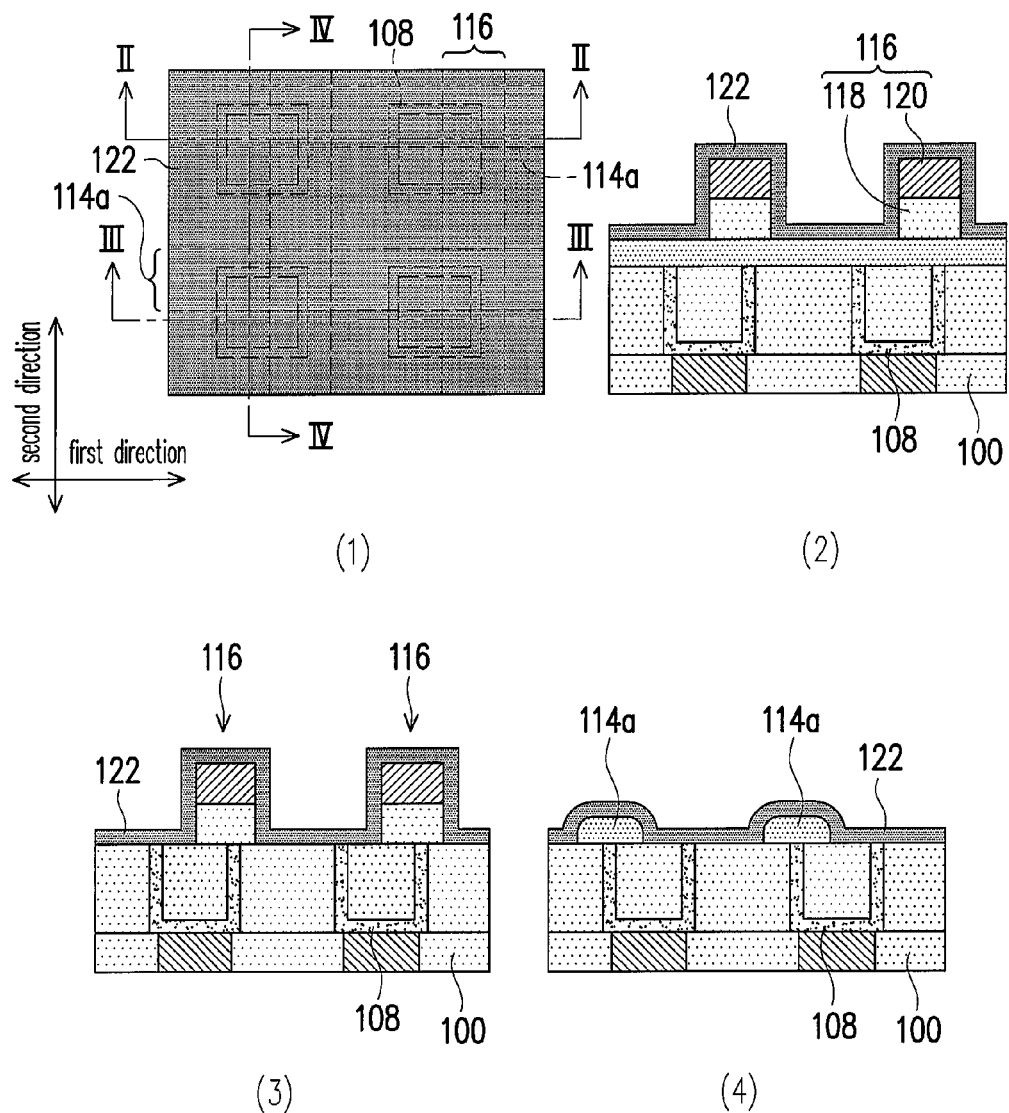

Referring to FIG. 2D, Part (1) is a top view of the device, and Part (2), Part (3), and Part (4) are sectional views along the line II-II, line III-III, and line IV-IV of Part (1) respectively. A plurality of stacked structures 116 is formed over the substrate 100, wherein each stacked structure 116 covers a portion of the area surrounded by each cup-shaped thermal electrode 108 in a second direction. The stacked structures 116 includes the third dielectric layers 118 and the top electrodes 120. As such, only a photolithography process is required for fabricating the stacked structures. The third dielectric layers and the top electrodes have self-aligned linewidths and sidewalls. A PC material film 122 is formed over the substrate 100 to cover the stacked structures 116 and the rounded second dielectric layers 114a.

Figure 2E:
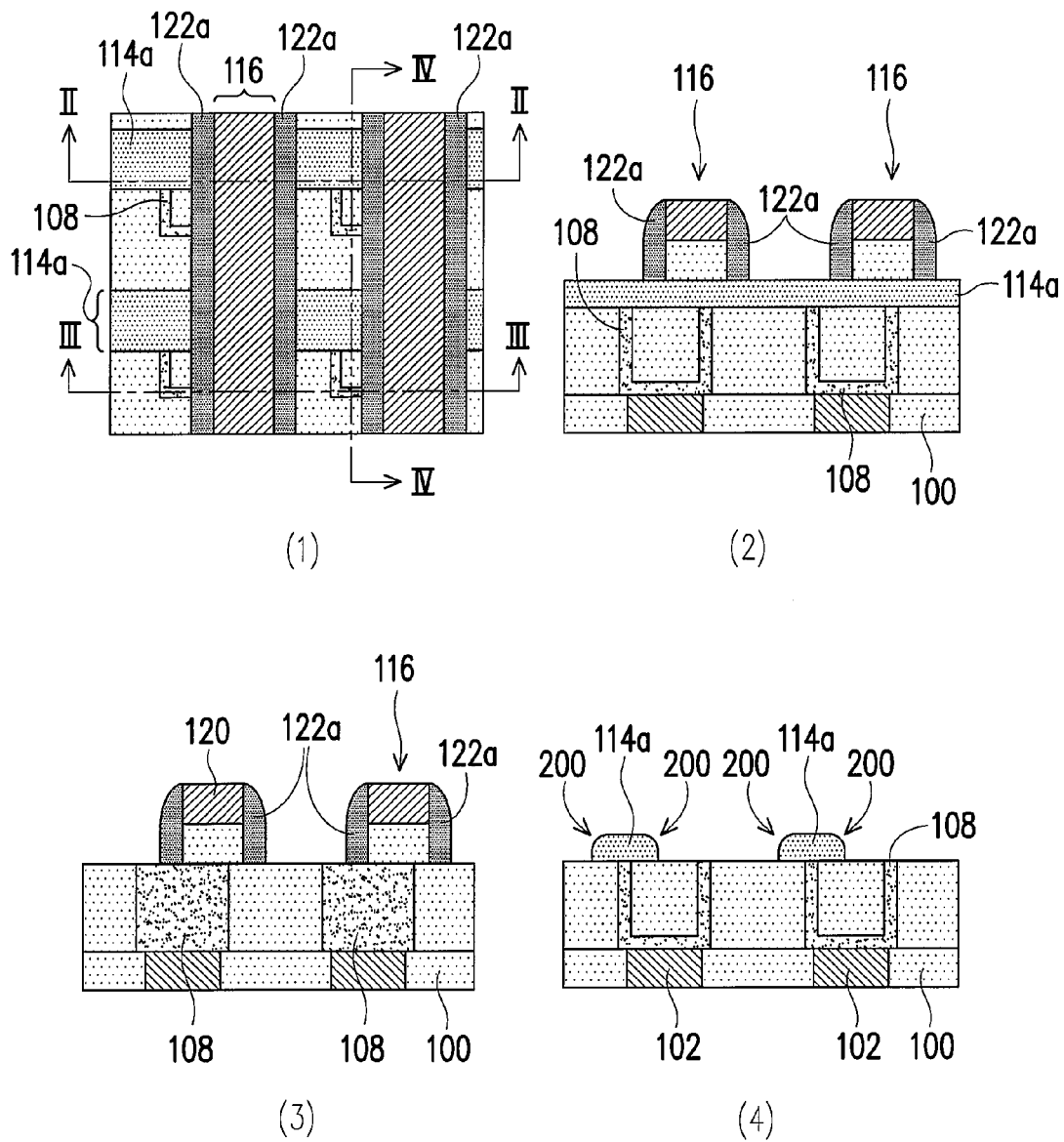

Referring to FIG. 2E, Part (1) is a top view of the device, Part (2), Part (3), and Part (4) are sectional views along the line II-II, line III-III, and line IV-IV of Part (1) respectively. The PC material film 122 (as shown in FIG. 2D) is anisotropically etched to form PC material spacers 122a on the sidewalls of the stacked structure 116, wherein each PC material spacer 122a contacts with each cup-shaped thermal electrode 108. It should be noted that due to the shape of the edges 200 of the rounded second dielectric layers 114a, PC material spacers 122a are not formed on the sidewalls of the second dielectric layers 114a.

Besides, the present invention can be applied in other semiconductor memory devices. For example, in the above embodiment of FIG. 2E, if the material of the PC material spacers 122a is changed to a conductive material, a non-volatile memory unit cell can be formed between the conductive spacer and each cup-shaped electrode. For example, the cup-shaped electrodes may be comprised of TiW, transition or refractory metal nitrides such as TiN or TaN, Al, Cu/TaN, polysilicon, amorphous silicon, PC materials, nitrided metal silicide or a metal silicide, and the conductive spacer may also be comprised of TiW, transition or refractory metal nitrides such as TiN or TaN, Al, Cu/TaN, polysilicon, amorphous silicon, PC materials, nitrided metal silicide or a metal silicide. The non-volatile memory unit cell may be a magnetic tunnel junction (MTJ) unit cell of the MRAM, an anti-fuse cell of the Mask ROM or the programmable ROM (PROM), a Resistance RAM (RRAM) unit cell, or a 3D-NVM unit cell. Moreover, the first and third dielectric layers may comprise silicon oxide, and the second dielectric layer may comprise nitride.

Figure 3:
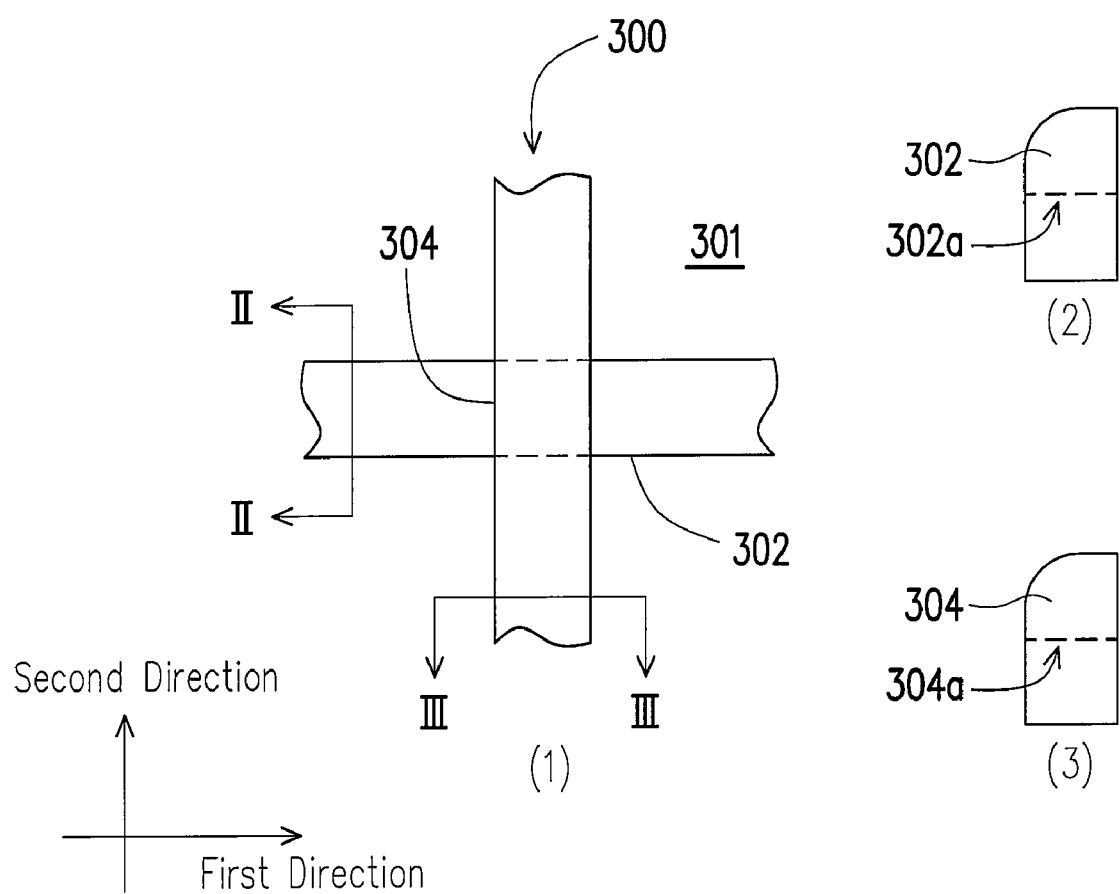
FIG. 3 is a simple view illustrating the structure according to a aspect of the present invention.

Additionally, FIG. 3 is a simple view illustrating the structure according to a aspect of the present invention.

Referring to FIG. 3, Part (1) is a top view of the structure, Part (2) and Part (3) are sectional views along the line II-II and line III-III of Part (1) respectively. A structure 300 at least includes two "crossed" electrode spacers which includes a bottom electrode spacer 302 and a top electrode spacer 304. The bottom electrode spacer 302 is disposed over a substrate 301 in a first direction, and the top electrode spacer 304 is crossed over the bottom electrode spacer 302 in a second direction. The bottom and top electrode spacers 302 and 304 may be optionally planarized by chemical mechanical polishing (CMP), and thus flat top surfaces (dotted line 302a and 304a) are formed as shown in Part (2) and Part (3).

In FIG. 3, the bottom electrode spacer 302 is a heating electrode such as TiN, or a metal spacer, or a semiconductor spacer such as poly-Si or amorphous Si, or a PC material spacer for example. Moreover, the top electrode spacer 304 is a metal spacer, or a semiconductor spacer such as poly-Si or amorphous Si, or a PC material spacer, for example. Furthermore, the bottom electrode spacer 302 further comprises a portion of a cup-shaped metal electrode, a portion of ring-shaped metal spacer electrode or a portion of a line-shaped metal spacer electrode. This kind of structure 300 can be used as the top and bottom electrodes of an MTJ of the MRAM, an Anti-Fuse of the PROM or the Mask ROM, a unit cell of the RRAM, or the like, and other equivalent non-volatile memory unit cells.

In summary, the present invention has the following characteristics.

1. In the structure of the present invention, the contact area between the PC material spacers and the cup-shaped thermal electrodes is smaller than that formed employing a photolithography process, wherein by controlling the area of the thickness of the PC material spacers and the cup shaped thermal electrode, the contact area can be rendered smaller than that of the "surface contact structure".

2. The process of the present invention is comparatively simpler than the conventional technique.

3. The present invention defines the contact area with the cup-shaped thermal electrodes by etching the spacers, thus completing the contact of the top electrodes, and thereby define the contact-hole structures of the present invention. Therefore, problems of current flow caused due to the misalignment between the phase change material and the contact holes of the top electrodes may be effectively avoided.

4. The structure of the present invention comprises a single contact hole.

5. The process of the present invention does not require filling the phase change material film in nano-sized contact holes, and therefore the difficulty of filling the nano-sized contact holes, or the difficulty of the plasma gas entering the nano-sized contact holes when the top of the films on sidewalls at two sides are jointed may be effectively avoided.

6. If the planarization process of the PC material film can successfully implemented in the future, the structure of the present invention may be applied in the 3D-NVM.

7. The cross spacer structure of the present invention is not limited to application in phase change memory. For example, a portion of the PC material spacers may be replaced with a conductive material such as TiN to serve as the top electrodes, non-volatile memory unit cells can be formed at the intersection of two crossed TiN's. Therefore, the physical and electrical contact between the non-volatile memory unit cell of nano-size and the top and bottom electrodes can be achieved more easily than the physical and electrical contact between the memory unit with an ordinary contact hole and the top and bottom electrodes. It can be easily understood from the lithographic overlay error. The non-volatile memory unit cell described herein can be an MTJ of the MRAM, an Anti-Fuse of the PROM or the Mask ROM, a unit cell of the RRAM, or the like, and other equivalent non-volatile memory unit cells can also be used.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase change memory (PCM) device, comprising:
   a substrate;
   a plurality of bottom electrodes, formed in the substrate;
   a first dielectric layer, disposed over the substrate;
   a plurality of cup-shaped thermal electrodes, disposed in the first dielectric layer, wherein each bottom of the cup-shaped thermal electrodes contacts one of the bottom electrodes;
   a plurality of second dielectric layers, disposed over the substrate in a first direction, wherein each of the second dielectric layers covers a portion of the area surrounded by each of the cup-shaped thermal electrodes;
   a plurality of third dielectric layers, disposed over the substrate in a second direction, wherein each of the third dielectric layers covers a portion of the area surrounded by each of the cup-shaped thermal electrodes, and overlays the second dielectric layers;
   a plurality of top electrodes, disposed over the third dielectric layers so that a plurality of stacked structures including the third dielectric layers and the top electrodes are formed over the substrate; and
   a plurality of phase change (PC) material spacers, disposed on sidewalls of the stacked structures, wherein the PC material spacers physically and electrically contact the cup-shaped thermal electrodes and the top electrodes.

2. The PCM device as claimed in claim 1, wherein the material of the cup-shaped thermal electrodes comprises transition or refractory metal nitrides, W, nitrided metal silicide, polysilicon, amorphous silicon or a metal silicide.

3. The PCM device as claimed in claim 1, wherein the material of the top electrodes comprise TiW, transition or refractory metal nitrides, Al, Cu/TaN, nitrided metal silicide, polysilicon, amorphous silicon or a metal silicide.

4. The PCM device as claimed in claim 1, wherein the first dielectric layers and the third dielectric layers are the same material other than silicon dioxide, and the second dielectric layers are a dielectric material with an etching selectivity with the first and third dielectric layers.

5. A semiconductor memory device, comprising:
   a substrate;
   a plurality of bottom electrodes, formed in the substrate;
   a first dielectric layer, disposed on the substrate;
   a plurality of cup-shaped electrodes, disposed in the first dielectric layer, wherein each bottom of the cup-shaped electrodes contacts one of the bottom electrodes;
   a plurality of second dielectric layers, disposed over the substrate in a first direction, wherein each of the second dielectric layers covers a portion of the area surrounded by each of the cup-shaped electrodes;
   a plurality of third dielectric layers, disposed over the substrate in a second direction, wherein the third dielectric layers covers a portion of the area surrounded by the cup-shaped electrodes, and overlays the second dielectric layers;
   a plurality of top electrodes, disposed over the third dielectric layers, wherein a plurality of stacked structure composed the third dielectric layers and the top electrodes is formed;
   a plurality of conductive spacers, disposed on sidewall of the stacked structure, wherein the conductive spacers physically and electrically contact the cup-shaped electrodes and top electrodes; and
   a non-volatile memory unit cell, formed between each of the conductive spacers and each of the cup-shaped electrodes.

6. The semiconductor memory device as claimed in claim 5, wherein the material of the cup-shaped electrodes comprises TiW, transition or refractory metal nitrides, Al, Cu/TaN, polysilicon, amorphous silicon, PC materials, nitrided metal silicide or a metal silicide.

7. The semiconductor memory device as claimed in claim 5, wherein the material of the conductive material spacers comprises TiW, transition or refractory metal nitrides, Al, Cu/TaN, polysilicon, amorphous silicon, PC materials, nitrided metal silicide or a metal silicide.

8. The semiconductor memory device as claimed in claim 5, wherein the first and third dielectric layers are the same material other than silicon dioxide, and the second dielectric layers are a dielectric material with an etching selectivity with the first and third dielectric layers.

9. The semiconductor memory device as claimed in claim 5, wherein the non-volatile memory unit cell comprises an MTJ unit cell of a MRAM, an anti-fuse cell of a Mask ROM or a PROM, or a unit cell of a RRAM.

* * * * *